United States Patent [19]
Sano

[11] Patent Number: 5,900,631
[45] Date of Patent: May 4, 1999

[54] HIGHLY SENSITIVE PHOTOCONDUCTIVE INFRARED DETECTOR

[75] Inventor: Masahiko Sano, Tokyo, Japan

[73] Assignee: NEC Corporation, Tokyo, Japan

[21] Appl. No.: 08/813,092

[22] Filed: Mar. 7, 1997

[30] Foreign Application Priority Data

Mar. 7, 1996 [JP] Japan ................................. 8-049950

[51] Int. Cl.$^6$ ....................................................... G01J 1/02
[52] U.S. Cl. ........................................ 250/338.4; 257/466
[58] Field of Search .............................. 250/338.4, 338.1, 250/370.12, 370.13, 370.14; 257/434, 435, 459, 466

[56] References Cited

U.S. PATENT DOCUMENTS 4,620,210 10/1986 Scavennec et al. ..................... 257/466
5,241,196 8/1993 Huang et al. ............................ 257/466

Primary Examiner—Michael J. Tokar
Assistant Examiner—Richard Hanig
Attorney, Agent, or Firm—Young & Thompson

[57] ABSTRACT

A semiconductor crystal infrared detecting portion structure is provided in a photoconductive infrared detector and is provided at opposite ends with first and second electrodes so biased that the first and second electrodes have a positive potential and a ground potential respectively. The semiconductor crystal infrared detecting portion structure has an infrared receiving part so that the semiconductor crystal infrared detecting portion structure comprises a first half region defined between the infrared receiving part and the first electrode and a second half region defined between the infrared receiving part and the second electrode. At least the second half region reduces in section area toward the second electrode to increase a resistance of at least the second half region.

40 Claims, 5 Drawing Sheets

HIGHLY SENSITIVE PHOTOCONDUCTIVE INFRARED DETECTOR

BACKGROUND OF THE INVENTION

The present invention relates to a photoconductive infrared detector, and more particularly to a highly sensitive photoconductive infrared detector with an increased electrical resistance and without substantive loss of average life time of excess minority carriers having been generated in a semiconductor crystal for detecting infrared.

The basic photoconductive infrared detector has a structure as illustrated in FIG. 1. A semiconductor crystal infrared ray detecting portion 1 is provided over a substrate 2. A plus electrode 5 and a ground electrode 6 are provided at opposite ends of the semiconductor crystal infrared detecting portion 1. The plus electrode 5 and the ground electrode 6 are distanced from each other in a lateral and longitudinal direction. A pair of top and, bottom passivation films 4 are provided on top and bottom surfaces of the semiconductor crystal infrared detecting portion 1. An adhesive is applied on a bottom surface of the bottom passivation film 4 so that the bottom passivation film 4 underlying the semiconductor crystal infrared ray detecting portion 1 is adhered on the substrate 2.

If the infrared is made incident into the semiconductor crystal infrared detecting portion 1, then excess minority carriers are generated in the semiconductor crystal infrared detecting portion 1. Those generated excess minority carriers varies an electrical resistance of the semiconductor crystal infrared detecting portion 1. The plus electrode 5 and the ground electrode 6 are biased to cause a bias current to flow from the plus electrode 5 toward the ground electrode 6. The variation in resistance of the semiconductor crystal infrared detecting portion 1 by generation of the excess minority carriers causes variation of the bias current flowing through the semiconductor crystal infrared detecting portion 1. It is therefore possible to detect the variation in electrical resistance of the semiconductor crystal infrared detecting portion 1 by detecting variation of the bias current. The variation in electrical resistance of the semiconductor crystal infrared detecting portion 1 depends upon the amount of the generated excess minority carriers. The amount of the generated excess minority carriers depends upon the intensity of the infrared having been made incident into the semiconductor crystal infrared detecting portion 1. Namely, any variation in the bias current flowing through the semiconductor crystal infrared detecting portion 1 means or teaches that any infrared has been made incident into the semiconductor crystal infrared detecting portion 1 whereby the excess minority carriers are generated in the semiconductor crystal infrared detecting portion 1 and flow through the same toward the ground electrode 6, wherein minority carriers are holes. The excess minority carriers having been generated will be recombined with electrons the average life time in the average. The average life time of the excess minority carriers depends upon the surface state and property of the semiconductor crystal infrared detecting portion 1. It is generally said that if the average life time of the excess minority carriers is long, then a variation in electrical resistance of the semiconductor crystal infrared detecting portion 1 caused by the incidence of the infrared is large. The large variation in electrical resistance of the semiconductor crystal infrared detecting portion 1 means that the photoconductive infrared detector is highly sensitive to the incident of the infrared. Namely, it is desired that the average life time of the excess minority carriers is as long as possible to ensure a possible high sensitivity to the infrared. In order to obtain a possibly long average life time of the excess minority carriers generated in the semiconductor crystal infrared detecting portion 1, it is required to prevent the recombination of the excess minority carriers or holes with electrons. In order to prevent the recombination of the excess minority carriers with electrons, the above top and bottom passivation films 4 are effective.

The above conventional infrared detector structure are, however, engaged with the following problems. In order to prevent the recombination of the excess minority carriers, the semiconductor crystal infrared detecting portion 1 are coated with the passivation films 4 but only the top and bottom surfaces thereof, whilst opposite side walls and the opposite ends of the semiconductor crystal infrared detecting portion 1 are not coated by the passivation films 4, wherein the opposite side walls are distanced from each other in a horizontal direction vertical to the longitudinal direction. The recombination velocity of the excess minority carriers is extremely large in the vicinity of the opposite side walls and the opposite ends of the semiconductor crystal infrared detecting portion 1. Namely, the excess minority carriers are immediately recombined and disappeared in the vicinity of the opposite side walls and the opposite ends of the semiconductor crystal infrared ray detecting portion 1. These phenomenon teach that the average life time of the excess minority carriers are short and thus the above conventional infrared ray detector has a deteriorated sensitivity to the infrared ray.

In order to settle the above problem with deterioration of the sensitivity to the infrared, it was proposed to other infrared detector which has a structure as illustrated in FIGS. 2A and 2B. This infrared detector is disclosed in the Japanese laid-open patent application No. 63-11821. A semiconductor crystal infrared ray detecting portion 1 is provided over a substrate 2. A plus electrode 5 and a ground electrode 6 are provided at opposite ends of the semiconductor crystal infrared detecting portion 1. The plus electrode 5 and the ground electrode 6 are distanced from each other in a lateral and longitudinal direction. A pair of top and bottom passivation films 4 are provided on top and bottom surfaces of the semiconductor crystal infrared detecting portion 1. An adhesion is applied on a bottom surface of the bottom passivation film 4 so that the bottom passivation film 4 underlying the semiconductor crystal infrared detecting portion 1 is adhered on the substrate 2. Infrared ZnS insulation film 7 transparent to the infrared is provided which extends over the top portions of the plus electrode 5 and the ground electrode 6 as well as over the top passivation film 4. Infrared shielding mask 8 is provided over the infrared ZnS insulation film 7 for shielding the infrared. The infrared shielding mask 8 is square-shaped. The infrared shielding mask 8 has a window 9 which is also square-shaped at the center position so as to allow the infrared ray to be incident through the window 9 and the infrared ZnS insulation film 7 into the center portion of the semiconductor crystal infrared detecting portion 1. The window 9 of the infrared shielding mask 8 has a sufficiently small area as compared to an area of the semiconductor crystal infrared detecting portion 1. The semiconductor crystal infrared ray detecting portion 1 is made of HgcdTe. A distance between the edge of the window 9 of the infrared shielding mask 8 and the side wall of the semiconductor crystal infrared detecting portion 1 is set larger than a diffusion length, for example, 20 micrometers, of carriers or excess minority carriers generated so as to suppress a recombination of the generated excess minority carriers in the vicinity of side walls of the semiconductor crystal infrared detecting portion 1. This contributes to suppress a remarkable loss of the average life time of the excess minority carriers generated in the semiconductor crystal infrared detecting portion 1 thereby allowing an improvement in sensitivity of the infrared detector.

The sensitivity of the photoconductive infrared detector depends not only upon the above average life time of the excess minority carriers generated in the semiconductor crystal infrared detecting portion 1 but also upon a resistance of the semiconductor crystal infrared ray detecting portion 1. If the resistance of the semiconductor crystal infrared detecting portion 1 is large, then the variation in resistance of the semiconductor crystal infrared detecting portion 1 due to generation of excess minority carriers therein is also large. If the variation in resistance of the semiconductor crystal infrared detecting portion 1 due to generation of excess minority carriers therein is large, this means that the sensitivity of the photoconductive infrared detector is also high.

The infrared ray is made incident through the window 9 of the infrared shielding mask 8 and the infrared transparent ZnS insulation film 7 into the center portion of the semiconductor crystal infrared detecting portion 1 whereby excess minority carriers are generated in the center area of the semiconductor crystal infrared detecting portion 1 and are drifted through the semiconductor crystal infrared ray detecting portion 1 to the ground electrode 6 Namely, the generated excess minority carriers flow through the half portion of the semiconductor crystal infrared detecting portion 1 in the ground electrode side, for which reason the electrical resistance to the excess minority carriers is substantially determined by the half portion of the semiconductor crystal infrared detecting portion 1 in the ground electrode side. The substantial electrical resistance of the semiconductor crystal infrared detecting portion 1 is determined between the center area of the semiconductor crystal infrared detecting portion 1 and the ground electrode 6. As well illustrated in FIG. 2A, the semiconductor crystal infrared detecting portion 1 has a wide width which remains unchanged between the plus electrode 5 and the ground electrode 6. Namely, the wide width of the semiconductor crystal infrared ray detecting portion 1 in the half area in the ground electrode 6 provides a low resistance which causes a deterioration in the sensitivity of the above conventional photoconductive infrared detector. Namely, it is difficult for the above conventional photoconductive infrared detector to ensure the required high sensitivity.

In the above circumstances, it is required to develop a novel highly sensitive photoconductive infrared detector having a high electrical resistance and ensuring a long average life time of excess minority carriers generated in a semiconductor crystal infrared detecting portion provided in the photoconductive infrared detector.

SUMMARY OF THE INVENTION

Accordingly, it is an object of the present invention to provide a novel highly sensitive photoconductive infrared detector free from any problems as described above.

It is a further object of the present invention to provide a novel highly sensitive photoconductive infrared detector having a high electrical resistance.

It is a further more object of the present invention to provide a novel highly sensitive photoconductive infrared detector ensuring a long average life time of excess minority carriers generated in a semiconductor crystal infrared detecting portion provided in the photoconductive infrared ray detector.

The above and other objects, features and advantages of the present invention will be apparent from the following descriptions.

The present invention provides a photoconductive infrared detector comprising the following elements. A bottom passivation film formed on a substrate for keeping an interface potential to be positive. A semiconductor crystal infrared detecting portion is provided on the bottom passivation film. A pair of first and second electrodes is provided at opposite ends of the semiconductor crystal infrared ray detecting portion. The first and second electrodes are biased so that the first and second electrodes have a positive potential and a ground potential respectively. A top passivation film is formed on a top surface of the semiconductor crystal infrared ray detecting portion for keeping an interface potential to be positive. The top passivation film is transparent to infrared. Infrared shielding mask is provided over the top passivation film for shielding infrared. The infrared shielding mask has a window for allowing incidence of infrared through the top passivation film into an infrared receiving part of the semiconductor crystal infrared detecting portion so that excess minority carriers generated by incidence of infrared into the infrared receiving part are moved toward the second electrode. The infrared receiving part is defined to be a limited area positioned under the window. The semiconductor crystal infrared detecting portion comprises a first half region defined between the infrared receiving part and the first electrode and a second half region defined between the infrared receiving part and the second electrode. It is essential that at least the second half region reduces in section area toward the second electrode to increase a resistance of at least the second half region.

The present invention also provides a semiconductor crystal infrared detecting portion structure provided in a photoconductive infrared detector. The semiconductor crystal infrared detecting portion structure is provided at opposite ends with first and second electrodes so biased that the first and second electrodes have a positive potential and a ground potential respectively. The semiconductor crystal infrared detecting portion structure has an infrared receiving part so that the semiconductor crystal infrared detecting portion structure comprises a first half region defined between the infrared receiving part and the first electrode and a second half region defined between the infrared receiving part and the second electrode. It is essential that at least the second half region reduces in section area toward the second electrode to increase a resistance of at least the second half region.

BRIEF DESCRIPTIONS OF THE DRAWINGS

Preferred embodiments of the present invention will be described in detail with reference to the accompanying drawings.

DISCLOSURE OF THE INVENTION

Figure 1:
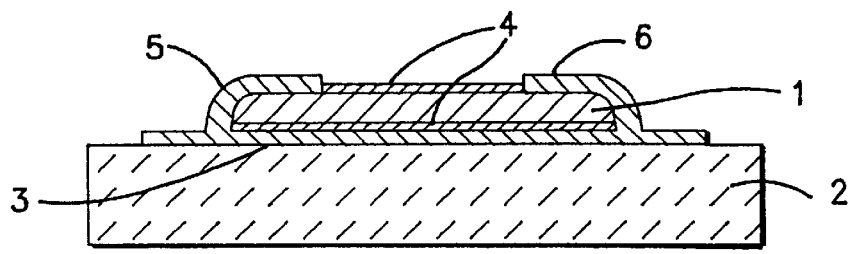
FIG. 1 is a fragmentary cross sectional elevation view illustrative of the conventional photoconductive infrared detector.
Figure 2A:
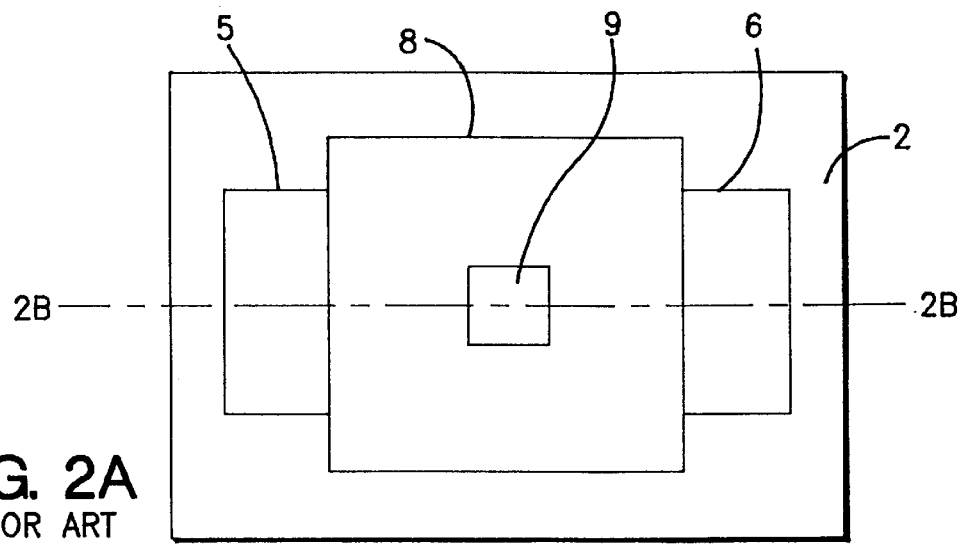
FIG. 2A is a plane view illustrative of the other conventional photoconductive infrared detector.
Figure 2B:
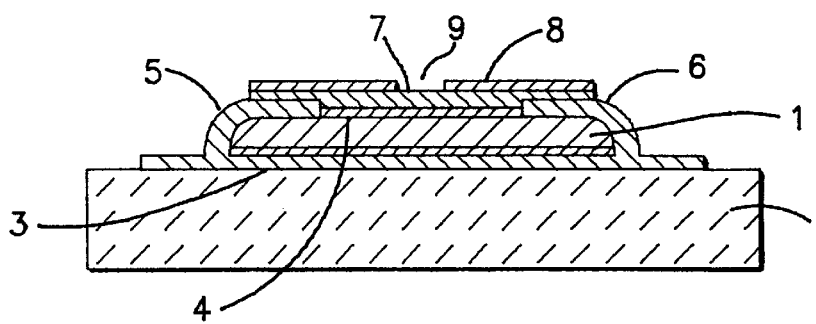
FIG. 2B is a fragmentary cross sectional elevation view on the line 2B—2B of FIG. 2A, illustrative of the other conventional photoconductive infrared ray detector.

The present invention provides a photoconductive infrared detector comprising the following elements. A bottom passivation film formed on a substrate for keeping an interface potential to be positive. A semiconductor crystal infrared detecting portion is provided on the bottom passivation film. A pair of first and second electrodes is provided at opposite ends of the semiconductor crystal infrared detecting portion. The first and second electrodes are biased so that the first and second electrodes have a positive potential and a ground potential respectively. A top passivation film is formed on a top surface of the semiconductor crystal infrared detecting portion for keeping an interface potential to be positive. The top passivation film is transparent to infrared. An infrared shielding mask is provided over the top passivation film for shielding infrared. The infrared shielding mask has a window for allowing an incidence of infrared through the top passivation film into infrared receiving part of the semiconductor crystal infrared detecting portion so that excess minority carriers generated by incidence of infrared into the infrared receiving part are moved toward the second electrode. The infrared receiving part is defined to be a limited area positioned under the window. The semiconductor crystal infrared detecting portion comprises a first half region defined between the infrared receiving part and the first electrode and a second half region defined between the infrared receiving part and the second electrode. It is essential that at least the second half region reduces in section area toward the second electrode to increase a resistance of at least the second half region.

It is preferable that the semiconductor crystal infrared detecting portion reduces in section area toward the second electrode.

It is further preferable that the semiconductor crystal infrared ray detecting portion remains unchanged in thickness but reduces in width toward the second electrode.

It is further more preferable that the semiconductor crystal infrared detecting portion does proportionally and linearly reduce in width toward the second electrode so that side edge outlines in plane view of the semiconductor crystal infrared detecting portion describe straight lines.

Alternatively, it is further more preferable that the semiconductor crystal infrared detecting portion does smoothly and curvilinearly reduce in width toward the second electrode so that side edge outlines in plane view of the semiconductor crystal infrared detecting portion describe smooth curves. In this case, it is more preferable that the semiconductor crystal infrared detecting portion does exponentially reduce in width toward the second electrode so that side edge outlines in plane view of the semiconductor crystal infrared detecting portion describe symmetrical exponential function curves. In this case, it is further more preferable that each of the symmetrical exponential function curves is given by $F(X)=A/[1+\exp\{(X-B)/C\}]$, where A, B, and C are constants and $F(X)$ is a distance of the side edge of the semiconductor crystal infrared detecting portion from an X-axis which is defined to be a longitudinal center axis of the semiconductor crystal infrared detecting portion and "X" represents a position on the X-axis. Alternatively, it is further more preferable that each of the symmetrical exponential function curves is given by $F(X)=D\times\exp(-EX)$, where D and E are constants and $F(X)$ is a distance of the side edge of the semiconductor crystal infrared ray detecting portion from an X-axis which is defined to be a longitudinal center axis of the semiconductor crystal infrared detecting portion and "X" represents a position on the X-axis.

It is also preferable that the semiconductor crystal infrared detecting portion does non-smoothly and non-linearly reduce in width toward the second electrode so that side edge outlines in plane view of the semiconductor crystal infrared detecting portion describe non-smooth and non-linear lines.

It is also preferable that only the second half region of the semiconductor crystal infrared detecting portion does proportionally and linearly reduce in width toward the second electrode so that side edge outlines in plane view of the second half region describe straight lines.

It is also preferable that only the second half region of the semiconductor crystal infrared detecting portion does smoothly and curvilinearly reduce in width toward the second electrode so that side edge outlines in plane view of the second half region describe smooth curves. In this case, it is further preferable that only the second half region of the semiconductor crystal infrared detecting portion does exponentially reduce in width toward the second electrode so that side edge outlines in plane view of the second half region describe symmetrical exponential function curves. In this case, it is further more preferable that each of the symmetrical exponential function curves is given by $F(X)=A/[1+\exp\{(X-B)/C\}]$, where A, B, and C are constants and $F(X)$ is a distance of the side edge of the semiconductor crystal infrared detecting portion from an X-axis which is defined to be a longitudinal center axis of the semiconductor crystal infrared detecting portion and "X" represents a position on the X-axis. Alternatively, it is further more preferable that each of the symmetrical exponential function curves is given by $F(X)=D\times\exp(-EX)$, where D and E are constants and $F(X)$ is a distance of the side edge of the semiconductor crystal infrared detecting portion from an X-axis which is defined to be a longitudinal center axis of the semiconductor crystal infrared detecting portion and "X" represents a position on the X-axis.

It is also preferable that only the second half region of the semiconductor crystal infrared detecting portion does non-smoothly and non-linearly reduce in width only the second half region describe non-smooth and non-linear lines.

It is also preferable that the first half region of the semiconductor crystal infrared detecting portion does smoothly and curvilinearly reduce in width toward the second electrode so that side edge outlines in plane view of the first half region describe smooth curves, while the second half region of the semiconductor crystal infrared detecting portion does proportionally and linearly reduce in width toward the second electrode so that side edge outlines in plane view of the second half region describe straight lines.

It is also preferable that the first half region of the semiconductor crystal infrared ray detecting portion does proportionally and linearly reduce in width toward the second electrode so that side edge outlines in plane view of the first half region describe straight lines, while the second half region of the semiconductor crystal infrared detecting portion does smoothly and curvilinearly reduce in width toward the second electrode so that side edge outlines in plane view of the second half region describe smooth curves. In this case, it is further preferable that the second half region of the semiconductor crystal infrared detecting portion does exponentially reduce in width toward the second electrode so that side edge outlines in plane view of the second half region describe symmetrical exponential function curves. In this case, it is further more preferable that each of the symmetrical exponential function curves is given by $F(X)=A/[1+\exp\{(X-B)/C\}]$, where A, B, and C are constants and $F(X)$ is a distance of the side edge of the semiconductor crystal infrared detecting portion from an X-axis which is defined to be a longitudinal center axis of the semiconductor crystal infrared ray detecting portion and "X" represents a position on the X-axis. Alternatively, it is further more preferable that each of the symmetrical exponential function curves is given by $F(X)=D\times\exp(-EX)$, where D and E are constants and $F(X)$ is a distance of the side edge of the semiconductor crystal infrared detecting portion from an X-axis which is defined to be a longitudinal center axis of the semiconductor crystal infrared detecting portion and "X" represents a position on the X-axis.

The present invention also provides a semiconductor crystal infrared detecting portion structure provided in a photoconductive infrared detector. The semiconductor crystal infrared detecting portion structure is provided at opposite ends with first and second electrodes so biased that the first and second electrodes have a positive potential and a ground potential respectively. The semiconductor crystal infrared detecting portion structure has an infrared receiving part so that the semiconductor crystal infrared detecting portion structure comprises a first half region defined between the infrared receiving part and the first electrode and a second half region defined between the infrared receiving part and the second electrode. It is essential that at least the second half region reduces in section area toward the second electrode to increase a resistance of at least the second half region.

It is preferable that the semiconductor crystal infrared detecting portion structure reduces in section area toward the second electrode.

It is further preferable that the semiconductor crystal infrared detecting portion structure remains unchanged in thickness but reduces in width toward the second electrode.

It is further more preferable that the semiconductor crystal infrared ray detecting portion structure does proportionally and linearly reduce in width toward the second electrode so that side edge outlines in plane view of the semiconductor crystal infrared detecting portion structure describe straight lines.

Alternatively, it is further more preferable that the semiconductor crystal infrared detecting portion structure does smoothly and curvilinearly reduce in width toward the second electrode so that side edge outlines in plane view of the semiconductor crystal infrared detecting portion structure describe smooth curves. In this case, it is more preferable that the semiconductor crystal infrared detecting portion structure does exponentially reduce in width toward the second electrode so that side edge outlines in plane view of the semiconductor crystal infrared detecting portion structure describe symmetrical exponential function curves. In this case, it is further more preferable that each of the symmetrical exponential function curves is given by $F(X)=A/[1+\exp\{(X-B)/C\}]$, where A, B, and C are constants and $F(X)$ is a distance of the side edge of the semiconductor crystal infrared detecting portion structure from an X-axis which is defined to be a longitudinal center axis of the semiconductor crystal infrared detecting portion structure and "X" represents a position on the X-axis. Alternatively, it is further more preferable that each of the symmetrical exponential function curves is given by $F(X)=D\times\exp(-EX)$, where D and E are constants and $F(X)$ is a distance of the side edge of the semiconductor crystal infrared detecting portion structure from an X-axis which is defined to be a longitudinal center axis of the semiconductor crystal infrared detecting portion structure and "X" represents a position on the X-axis.

It is also preferable that the semiconductor crystal infrared detecting portion structure does non-smoothly and non-linearly reduce in width toward the second electrode so that side edge outlines in plane view of the semiconductor crystal infrared detecting portion structure describe non-smooth and non-linear lines.

It is also preferable that only the second half region of the semiconductor crystal infrared detecting portion structure does proportionally and linearly reduce in width toward the second electrode so that side edge outlines in plane view of the second half region describe straight lines.

It is also preferable that only the second half region of the semiconductor crystal infrared detecting portion structure does smoothly and curvilinearly reduce in width toward the second electrode so that side edge outlines in plane view of the second half region describe smooth curves. In this case, it is further preferable that only the second half region of the semiconductor crystal infrared detecting portion structure does exponentially reduce in width toward the second electrode so that side edge outlines in plane view of the second half region describe symmetrical exponential function curves. In this case, it is further more preferable that each of the symmetrical exponential function curves is given by $F(X)=A/[1+\exp\{(X-B)/C\}]$, where A, B, and C are constants and $F(X)$ is a distance of the side edge of the semiconductor crystal infrared detecting portion structure from an X-axis which is defined to be a longitudinal center axis of the semiconductor crystal infrared ray detecting portion structure and "X" represents a position on the X-axis. Alternatively, it is further more preferable that each of the symmetrical exponential function curves is given by $F(X)=D\times\exp(-EX)$, where D and E are constants and $F(X)$ is a distance of the side edge of the semiconductor crystal infrared ray detecting portion structure from an X-axis which is defined to be a longitudinal center axis of the semiconductor crystal infrared detecting portion structure and "X" represents a position on the X-axis.

It is also preferable that only the second half region of the semiconductor crystal infrared ray detecting portion structure does non-smoothly and non-linearly reduce in width only the second half region describe non-smooth and non-linear lines.

It is also preferable that the first half region of the semiconductor crystal infrared detecting portion structure does smoothly and curvilinearly reduce in width toward the second electrode so that side edge outlines in plane view of the first half region describe smooth curves, while the second half region of the semiconductor crystal infrared detecting portion structure does proportionally and linearly reduce in width toward the second electrode so that side edge outlines in plane view of the second half region describe straight lines.

It is also preferable that the first half region of the semiconductor crystal infrared detecting portion structure does proportionally and linearly reduce in width toward the second electrode so that side edge outlines in plane view of the first half region describe straight lines, while the second half region of the semiconductor crystal infrared detecting portion structure does smoothly and curvilinearly reduce in width toward the second electrode so that side edge outlines in plane view of the second half region describe smooth curves. In this case, it is further preferable that the second half region of the semiconductor crystal infrared detecting portion structure does exponentially reduce in width toward the second electrode so that side edge outlines in plane view of the second half region describe symmetrical exponential function curves. In this case, it is further more preferable that each of the symmetrical exponential function curves is given by $F(X)=A/[1+\exp\{(X-B)/C\}]$, where A, B, and C are constants and F(X) is a distance of the side edge of the semiconductor crystal infrared ray detecting portion structure from an X-axis which is defined to be a longitudinal center axis of the semiconductor crystal infrared detecting portion structure and "X" represents a position on the X-axis. Alternatively, it is further more preferable that each of the symmetrical exponential function curves is given by $F(X)=D\times\exp(-EX)$, where D and E are constants and F(X) is a distance of the side edge of the semiconductor crystal infrared ray detecting portion structure from an X-axis which is defined to be a longitudinal center axis of the semiconductor crystal infrared detecting portion structure and "X" represents a position on the X-axis.

PREFERRED EMBODIMENTS

A first embodiment according to the present invention will be described in detail with reference to FIGS. 3A, 3B, 4, 6 and 7, wherein a novel highly sensitive photoconductive infrared detector is provided, which has a high electrical resistance and ensuring a long average life time of excess minority carriers generated in a semiconductor crystal infrared detecting portion provided in the photoconductive infrared detector.

Figure 3A:
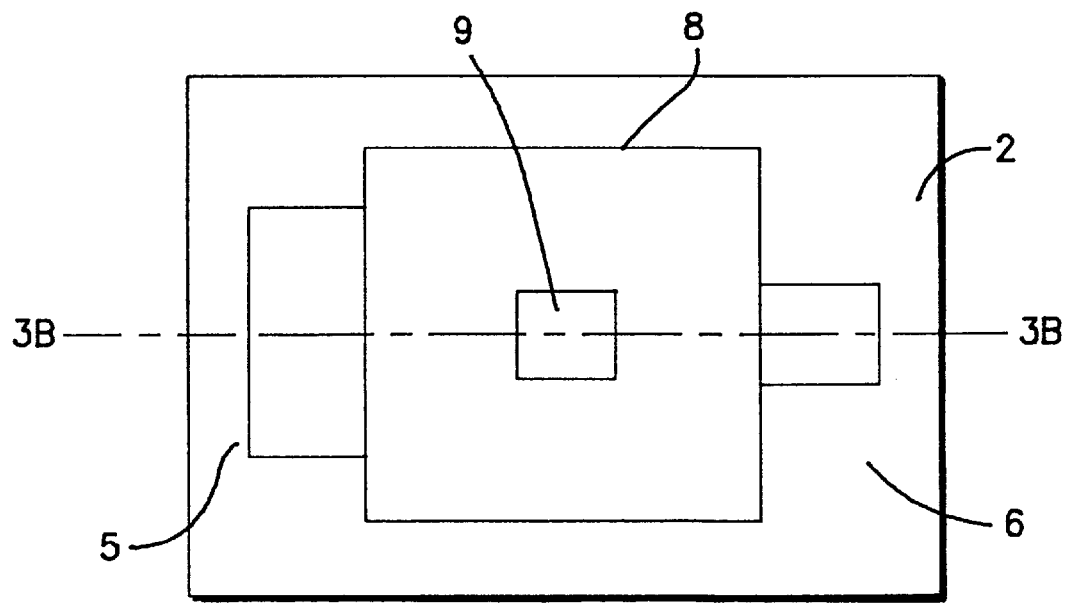
FIG. 3A is a plane view illustrative of a novel photoconductive infrared detector in accordance with the present invention.
Figure 3B:
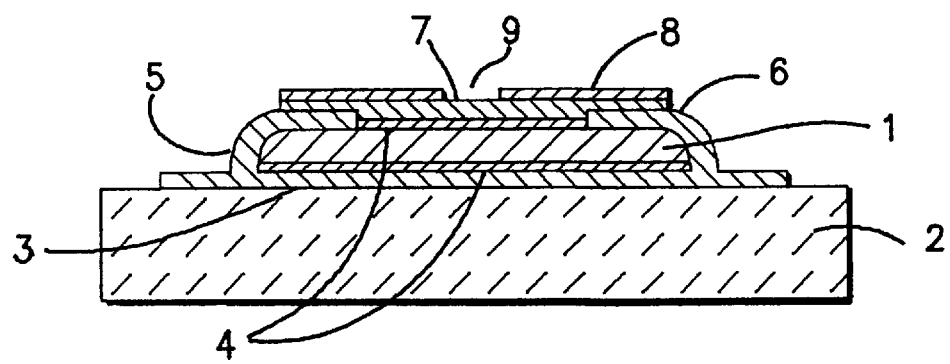
FIG. 3B is a fragmentary cross sectional elevation view on the line 3B—3B of FIG. 3A, illustrative of a novel photoconductive infrared ray detector in accordance with the present invention.

As illustrated in FIGS. 3A and 3B, a semiconductor crystal infrared ray detecting portion 1 is provided over a substrate 2. A plus electrode 5 and a ground electrode 6 are provided at opposite ends of the semiconductor crystal infrared ray detecting portion 1. The plus electrode 5 and the ground electrode 6 are distanced from each other in a lateral and longitudinal direction. A pair of top and bottom passivation films 4 are provided on top and bottom surfaces of the semiconductor crystal infrared detecting portion 1. An adhesion is applied on a bottom surface of the bottom passivation film 4 so that the bottom passivation film 4 underlying the semiconductor crystal infrared ray detecting portion 1 is adhered on the substrate 2. Infrared ZnS insulation film 7 transparent to the infrared ray is provided which extends over the top portions of the plus electrode 5 and the ground electrode 6 as well as over the top passivation film 4. Infrared shielding mask 8 is provided over the infrared ZnS insulation film 7 for shielding the infrared. The infrared shielding mask 8 is square-shaped. The infrared shielding mask 8 has a window 9 which is also square-shaped at the center position so as to allow the infrared to be incident through the window 9 and the infrared ray ZnS insulation film 7 into the center portion of the semiconductor crystal infrared detecting portion 1. The window 9 of the infrared shielding mask 8 has a sufficiently small area as compared to an area of the semiconductor crystal infrared detecting portion 1. The semiconductor crystal infrared detecting portion 1 is made of $H_{g1-x}Cd_xTe$, wherein x=0.235. The semiconductor crystal infrared detecting portion 1 has a majority carrier concentration of $1\times10^{14}$ cm$^{-3}$ and an electron mobility of $1.3\times10^5$ cm$^{-2}$/Vsec at a temperature of 77 K. The substrate 2 is made of sapphire which has a sufficiently high heat conductivity and electrical insulation. The adhesive 3 is epoxy resin adhesive. The semiconductor crystal infrared detecting portion 1 was once bonded on the substrate 2 for subsequent polishing and wet etching of the surface of the semiconductor crystal infrared detecting portion 1 until the thickness thereof is reduced to about 7 micrometers. The semiconductor crystal infrared detecting portion 1 is defined by Ar ion beam etching which uses a photo-resist pattern as a mask. The plus electrode 5 and the ground electrode 6 are formed by Cr evaporation and subsequent Au evaporation. The top and bottom passivation films 4 comprise anodic oxide films for keeping top and bottom interface potentials to be positive so as to suppress recombination of excess minority carriers on the interfaces. The thickness of the infrared ZnS insulation film 7 is 0.9 micrometers so that the infrared ZnS insulation film 7 can serve as an infrared anti-reflecting coating film. The infrared ray shielding mask 8 is formed by Cr evaporation and subsequent Au evaporation.

The semiconductor crystal infrared detecting portion 1 comprises a first half portion positioned in a side of the plus electrode 5 and a second half portion positioned in a side of the ground electrode 6. The window 9 of the infrared shielding mask 8 is positioned over a center area of the semiconductor crystal infrared detecting portion 1. If the infrared ray is made incident through the window 9 and the infrared shielding mask 8 into the center area of the semiconductor crystal infrared detecting portion 1, then excess minority carriers are generated in the center area of the semiconductor crystal infrared detecting portion 1. Since the plus electrode 5 and the ground electrode 6 are biased, the generated excess minority carriers are drifted through the second half portion of the semiconductor crystal infrared detecting portion 1 to the ground electrode 6.

It is important for the present invention that the semiconductor crystal infrared detecting portion 1 reduces in width toward the ground electrode 6. Namely, the semiconductor crystal infrared detecting portion 1 is tapered toward the ground electrode 6. The width of the semiconductor crystal infrared detecting portion 1 may be reduced proportionally and linearly. Alternatively, the width of the semiconductor crystal infrared detecting portion 1 may be reduced smoothly and curvilinearly toward the ground electrode. Further alternatively, the width of the semiconductor crystal infrared detecting portion 1 may be reduced in step-like toward the ground electrode. The reduction in the width of the semiconductor crystal infrared detecting portion 1 results in increase of the resistance thereof, for which reason the semiconductor crystal infrared detecting portion 1 increases in the resistance toward the ground electrode as the width or the section area of the semiconductor crystal infrared detecting portion 1 is reduced toward the ground electrode 6. Particularly, the resistance of the second half portion of the semiconductor crystal infrared detecting portion 1 in the ground electrode side is remarkably increased. Since the generated excess minority carriers are drifted through the second half portion of the semiconductor crystal infrared ray detecting portion 1 toward the ground electrode 6 by the bias between the plus electrode 5 and the ground electrode 6. Since the substantive resistance of the semiconductor crystal infrared detecting portion 1 depends upon the resistance of the second half portion of the semiconductor crystal infrared detecting portion 1, the substantive resistance of the semiconductor crystal infrared detecting portion 1 is remarkably increased, resulting in improvement in the sensitivity of the photoconductive infrared detector.

Figure 4:
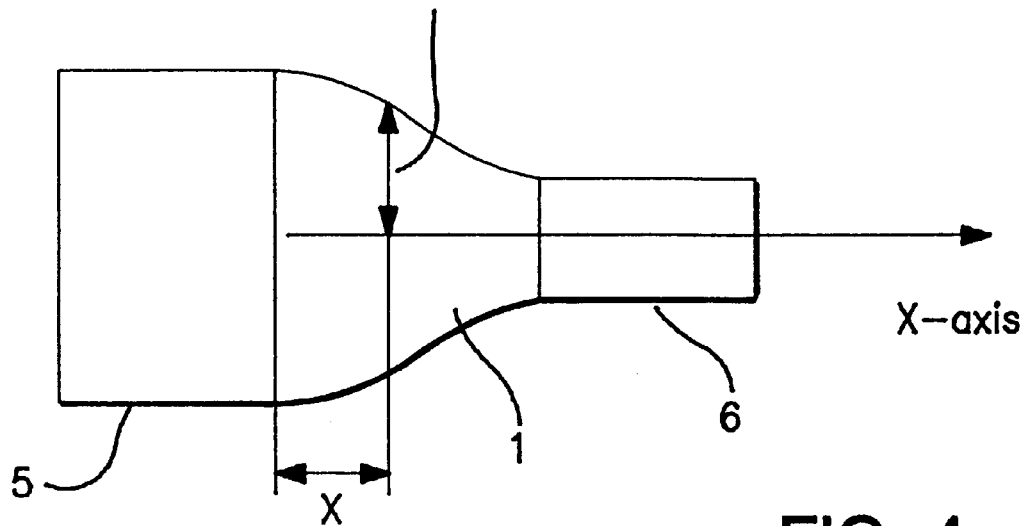
FIG. 4 is a top view illustrative of outlines of a semiconductor crystal infrared detecting portion provided in a novel photoconductive infrared detector of a first embodiment in accordance with the present invention.

For example, the width of the semiconductor crystal infrared detecting portion 1 may be reduced toward the ground electrode 6 so that outlines, in the top view, of side edges of the semiconductor crystal infrared detecting portion 1 describe symmetrical exponential function curves as illustrated in FIG. 4, wherein the exponential function is expressed as follows.

$$F(X)=A/[1+\exp\{(X-B)/C\}] \quad (1)$$

where F(X) is a distance of the side edge of the semiconductor crystal infrared ray detecting portion 1 from an X-axis which is defined to be a longitudinal center axis of the semiconductor crystal infrared detecting portion 1 and "X" represents a position on the X-axis. Further concretely, A=90 micrometers, B=75 micrometers, C=45 micrometers. A distance between the plus electrode 5 and the ground electrode 6 is 150 micrometers. The width of the plus electrode 5 is 150 micrometers. The width of the ground electrode is 25 micrometers. The width of the semiconductor crystal infrared detecting portion 1 is, therefore, reduced from 150 micrometers to 25 micrometers so that the outlines, in the top view, of side edges of the semiconductor crystal infrared detecting portion 1 describe symmetrical exponential function curves.

A distance between the edge of the window 9 of the infrared shielding mask 8 and the side wall of the semiconductor crystal infrared detecting portion 1 is set larger than a diffusion length, for example, 20 micrometers, of carriers or excess minority carriers generated so as to suppress a recombination of the generated excess minority carriers in the vicinity of side walls of the semiconductor crystal infrared detecting portion 1. This contributes to suppress a remarkable loss of the average life time of the excess minority carriers generated in the semiconductor crystal infrared detecting portion 1, thereby allowing an improvement in sensitivity of the infrared detector. Further, it is preferable that the distance between the edge of the window 9 of the infrared shielding mask 8 and the side wall of the semiconductor crystal infrared detecting portion 1 is set to be equal to the thickness of the semiconductor crystal infrared detecting portion 1. The window 9 is square-shaped to have a size of 50 micrometers/□. The window 9 is positioned at an intermediate position between the plus electrode 5 and the ground electrode 6 so that the distance of the window 9 from the plus electrode 5 is the same as the distance thereof from the ground electrode 6. A shortest distance between the window 9 and the side edges of the semiconductor crystal infrared detecting portion 1 is 7.8 micrometers.

The above described photoconductive infrared detector is cooled for operations at a liquid nitrogen temperature together with a view angle of 25 degrees and a band pass filter of 90% transmitance for allowing transmission of infrared ray of the wavelength range of 5.5 micrometers to 8.0 micrometers. It is observed that a background radiation is $6\times10^{15}$ ph/cm$^2$sec.

The measured resistance of the above novel photoconductive infrared ray detector is 118 Ω at a temperature of 77 K. This measured resistance value is higher by 54 Ω than the resistance of the conventional photoconductive infrared detector. Particularly, the measured resistance of the second half portion of the semiconductor crystal infrared detecting portion 1 is 83 Ω at a temperature of 77 K. This measured resistance value is higher than the resistance 27 Ω of the second half portion of the conventional photoconductive infrared detector. The measured average life time of the excess minority carriers of the above novel photoconductive infrared detector is about 1 microsecond which is the same as the conventional photoconductive infrared detector.

Figure 6:
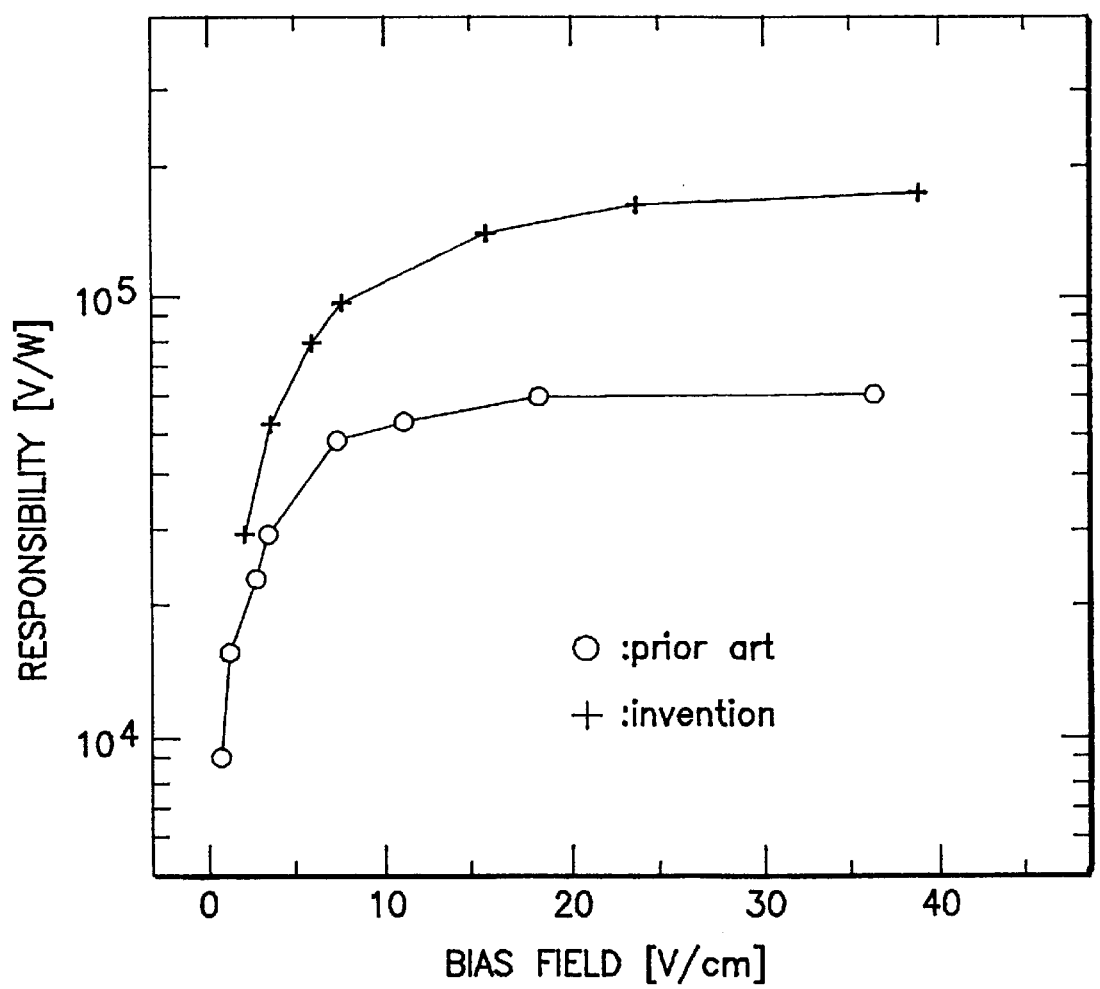
FIG. 6 is a diagram illustrative of variations in responsibility of novel and conventional photoconductive infrared detectors versus bias electric field.

The responsibility of the photoconductive infrared detector is measured as follows. A bias current at 0.3–10 mA is applied from the plus electrode 5 to the ground electrode 6. Infrared radiated from a blackbody furnace is pulsed with a chopper of a frequency of 800 Hz so that the pulsed infrared is made incident into the photoconductive infrared detector. Each measured responsibility of the novel and conventional photoconductive infrared detectors is illustrated in FIG. 6. It is confirmed that the responsibility of the novel photoconductive infrared detector is higher by about 2.5 times than the responsibility of the conventional photoconductive infrared detector.

Figure 7:
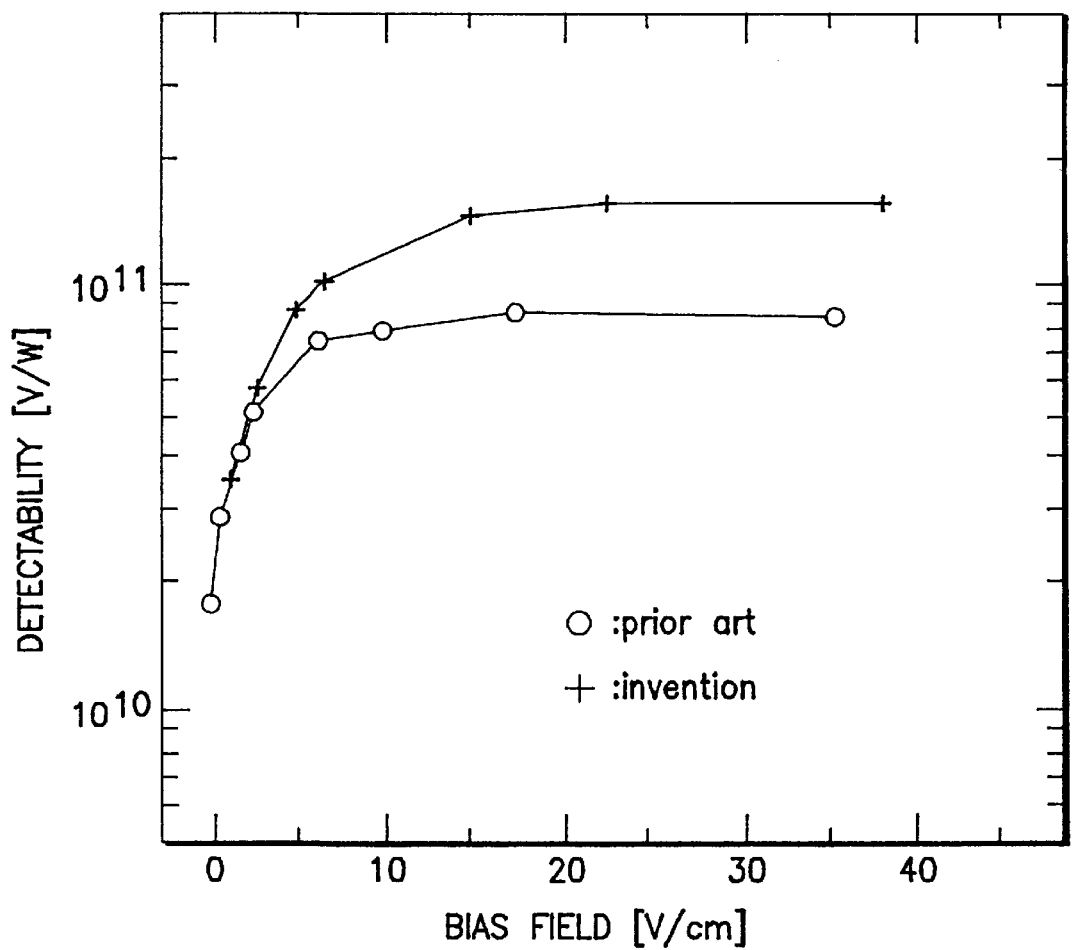
FIG. 7 is a diagram illustrative of variations in detectability of novel and conventional photoconductive infrared detectors versus bias electric field.

The delectability of the photoconductive infrared detector is measured at a frequency of 15 kHz. Each measured delectability of the novel and conventional photoconductive infrared detectors is illustrated in FIG. 7. It is confirmed that the delectability of the novel photoconductive infrared detector is higher by about 2 times than the delectability of the conventional photoconductive infrared detector. This means that the novel photoconductive infrared detector has a higher resolution by 2 times than the conventional photoconductive infrared detector.

A second embodiment according to the present invention will be described in detail with reference to FIGS. 3A, 3B, 5, 6 and 7, wherein a novel highly sensitive photoconductive infrared detector is provided, which has a high electrical resistance and ensuring a long average life time of excess minority carriers generated in a semiconductor crystal infrared detecting portion provided in the photoconductive infrared detector.

As illustrated in FIGS. 3A and 3B, a semiconductor crystal infrared detecting portion 1 is provided over a substrate 2. A plus electrode 5 and a ground electrode 6 are provided at opposite ends of the semiconductor crystal infrared ray detecting portion 1. The plus electrode 5 and the ground electrode 6 are distanced from each other in a lateral and longitudinal direction. A pair of top and bottom passivation films 4 are provided on top and bottom surfaces of the semiconductor crystal infrared detecting portion 1. An adhesion is applied on a bottom surface of the bottom passivation film 4 so that the bottom passivation film 4 underlying the semiconductor crystal infrared detecting portion 1 is adhered on the substrate 2. Infrared ZnS insulation film 7 transparent to the infrared is provided which extends over the top portions of the plus electrode 5 and the ground electrode 6 as well as over the top passivation film 4. Infrared shielding mask 8 is provided over the infrared ZnS insulation film 7 for shielding the infrared. The infrared shielding mask 8 is square-shaped. The infrared shielding mask 8 has a window 9 which is also square-shaped at the center position so as to allow the infrared to be incident through the window 9 and the infrared ZnS insulation film 7 into the center portion of the semiconductor crystal infrared detecting portion 1. The window 9 of the infrared shielding mask 8 has a sufficiently small area as compared to an area of the semiconductor crystal infrared detecting portion 1. The semiconductor crystal infrared detecting portion 1 is made of $H_{g1-x}Cd_xTe$, wherein x=0.235. The semiconductor crystal infrared ray detecting portion 1 has a majority carrier concentration of $1\times10^{14}$ cm$^{-3}$ and an electron mobility of $1.3\times10^5$cm$^{-2}$/Vsec at a temperature of 77 K. The substrate 2 is made of sapphire which has a sufficiently high heat conductivity and electrical insulation. The adhesive 3 is epoxy resin adhesive. The semiconductor crystal infrared detecting portion 1 was once bonded on the substrate 2 for subsequent polishing and wet etching of the surface of the semiconductor crystal infrared detecting portion 1 until the thickness thereof is reduced to about 7 micrometers. The semiconductor crystal infrared detecting portion 1 is defined by Ar ion beam etching which uses a photo-resist pattern as a mask. The plus electrode 5 and the ground electrode 6 are formed by Cr evaporation and subsequent Au evaporation. The top and bottom passivation films 4 comprise anodic oxide films for keeping top and bottom interface potentials to be positive so as to suppress recombination of excess minority carriers on the interfaces. The thickness of the infrared ZnS insulation film 7 is 0.9 micrometers so that the infrared ray ZnS insulation film 7 can serve as an infrared anti-reflecting coating film. The infrared shielding mask 8 is formed by Cr evaporation and subsequent Au evaporation.

The semiconductor crystal infrared detecting portion 1 comprises a first half portion positioned in a side of the plus electrode 5 and a second half portion positioned in a side of the ground electrode 6. The window 9 of the infrared shielding mask 8 is positioned over a center area of the semiconductor crystal infrared detecting portion 1. If the infrared is made incident through the window 9 and the infrared shielding mask 8 into the center area of the semiconductor crystal infrared detecting portion 1, then excess minority carriers are generated in the center area of the semiconductor crystal infrared detecting portion 1. Since the plus electrode 5 and the ground electrode 6 are biased, the generated excess minority carriers are drifted through the second half portion of the semiconductor crystal infrared detecting portion 1 to the ground electrode 6.

It is important for the present invention that the semiconductor crystal infrared ray detecting portion 1 reduces in width toward the ground electrode 6. Namely, the semiconductor crystal infrared detecting portion 1 is tapered toward the ground electrode 6. The width of the semiconductor crystal infrared detecting portion 1 may be reduced proportionally and linearly. Alternatively, the width of the semiconductor crystal infrared detecting portion I may be reduced smoothly and curvilinearly toward the ground electrode. Further alternatively, the width of the semiconductor crystal infrared detecting portion 1 may be reduced in step-like toward the ground electrode. The reduction in the width of the semiconductor crystal infrared detecting portion 1 results in increase of the resistance thereof, for which reason the semiconductor crystal infrared detecting portion 1 increases in the resistance toward the ground electrode as the width or the section area of the semiconductor crystal infrared detecting portion 1 is reduced toward the ground electrode 6. Particularly, the resistance of the second half portion of the semiconductor crystal infrared detecting portion 1 in the ground electrode side is remarkably increased. Since the generated excess minority carriers are drifted through the second half portion of the semiconductor crystal infrared detecting portion 1 toward the ground electrode 6 by the bias between the plus electrode 5 and the ground electrode 6. Since the substantive resistance of the semiconductor crystal infrared detecting portion 1 depends upon the resistance of the second half portion of the semiconductor crystal infrared detecting portion 1, the substantive resistance of the semiconductor crystal infrared detecting portion 1 is remarkably increased, resulting in improvement in the sensitivity of the photoconductive infrared ray detector.

Figure 5:
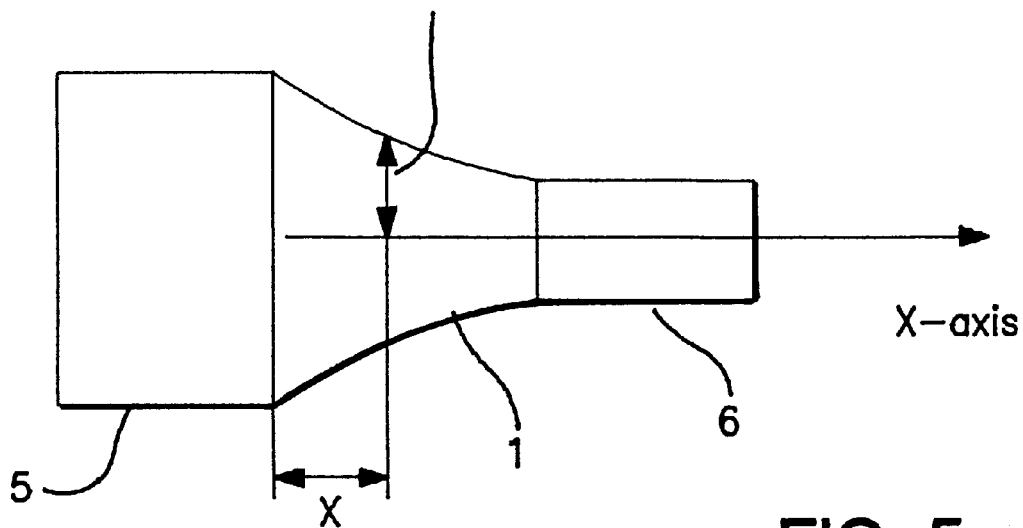
FIG. 5 is a top view illustrative of outlines of a semiconductor crystal infrared detecting portion provided in a novel photoconductive infrared detector of a second embodiment in accordance with the present invention.

For example, the width of the semiconductor crystal infrared detecting portion 1 may be reduced toward the ground electrode 6 so that outlines, in the top view, of side edges of the semiconductor crystal infrared detecting portion 1 describe symmetrical exponential function curves as illustrated in FIG. 5, wherein the exponential function is expressed as follows.

$$F(X)=D\times\exp(-EX) \qquad (2)$$

where F(X) is a distance of the side edge of the semiconductor crystal infrared detecting portion 1 from an X-axis which is defined to be a longitudinal center axis of the semiconductor crystal infrared detecting portion 1 and "X" represents a position on the X-axis. Further concretely, D=75 micrometers, E=54 micrometers. A distance between the plus electrode 5 and the ground electrode 6 is 150 micrometers. The width of the plus electrode 5 is 150 micrometers. The width of the ground electrode is 67 micrometers. The width of the semiconductor crystal infrared ray detecting portion 1 is, therefore, reduced from 150 micrometers to 67 micrometers so that the outlines, in the top view, of side edges of the semiconductor crystal infrared ray detecting portion 1 describe symmetrical exponential function curves.

A distance between the edge of the window 9 of the infrared shielding mask 8 and the side wall of the semiconductor crystal infrared detecting portion 1 is set larger than a diffusion length, for example, 20 micrometers, of carriers or excess minority carriers generated so as to suppress a recombination of the generated excess minority carriers in the vicinity of side walls of the semiconductor crystal infrared ray detecting portion 1. This contributes to suppress a remarkable loss of the average life time of the excess minority carriers generated in the semiconductor crystal infrared detecting portion 1, thereby allowing an improvement in sensitivity of the infrared detector. Further, it is preferable that the distance between the edge of the window 9 of the infrared shielding mask 8 and the side wall of the semiconductor crystal infrared detecting portion 1 is set to be equal to the thickness of the semiconductor crystal infrared detecting portion 1. The window 9 is square-shaped to have a size of 50 micrometers/□. The window 9 is positioned at an intermediate position between the plus electrode 5 and the ground electrode 6 so that the distance of the window 9 from the plus electrode 5 is the same as the distance thereof from the ground electrode 6. A shortest distance between the window 9 and the side edges of the semiconductor crystal infrared detecting portion 1 is 19 micrometers.

The above described photoconductive infrared detector is cooled for operations at a liquid nitrogen temperature together with a view angle of 25 degrees and a band pass filter of 90% transmitance for allowing transmission of infrared ray of the wavelength range of 5.5 micrometers to 8.0 micrometers. It is observed that a background radiation is $6\times10^{15}$ ph/cm$^2$sec.

The measured resistance of the above novel photoconductive infrared detector is 118 Ω at a temperature of 77 K. This measured resistance value is higher by 54 Ω than the resistance of the conventional photoconductive infrared detector. Particularly, the measured resistance of the second half portion of the semiconductor crystal infrared detecting portion 1 is 83 Ω at a temperature of 77 K. This measured resistance value is higher than the resistance 27 Ω of the second half portion of the conventional photoconductive infrared detector. The measured average life time of the excess minority carriers of the above novel photoconductive infrared detector is about 1 microsecond which is the same as the conventional photoconductive infrared detector.

The responsibility of the photoconductive infrared detector is measured as follows. A bias current at 0.3–10 mA is applied from the plus electrode 5 to the ground electrode 6. Infrared ray radiated from a blackbody furnace is pulsed with a chopper of a frequency of 800 Hz so that the pulsed infrared is made incident into the photoconductive infrared detector. Each measured responsibility of the novel and conventional photoconductive infrared detectors is illustrated in FIG. 6. It is confirmed that the responsibility of the novel photoconductive infrared detector is higher by about 2.5 times than the responsibility of the conventional photoconductive infrared detector. The delectability of the photoconductive infrared ray detector is measured at a frequency of 15 kHz. Each measured delectability of the novel and conventional photoconductive infrared detectors is illustrated in FIG. 7. It is confirmed that the delectability of the novel photoconductive infrared detector is higher by about 2 times than the delectability of the conventional photoconductive infrared detector. This means that the novel photoconductive infrared detector has a higher resolution by 2 times than the conventional photoconductive infrared detector.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A photoconductive infrared detector comprising:
    a substrate;
    a bottom passivation film formed on said substrate for keeping an interface potential to be positive;
    a semiconductor crystal infrared detecting portion provided on said bottom passivation film;
    a pair of first and second electrodes provided at opposite ends of said semiconductor crystal infrared detecting portion, said first and second electrodes being biased so that said first and second electrodes have a positive potential and a ground potential respectively;
    a top passivation film formed on a top surface of said semiconductor crystal infrared detecting portion for keeping an interface potential to be positive, said top passivation film being transparent to infrared; and
    an infrared shielding mask provided over said top passivation film for shielding infrared, said infrared shielding mask having a window for allowing an incidence of infrared through said top passivation film into an infrared receiving part of said semiconductor crystal infrared detecting portion so that excess minority carriers generated by incidence of infrared into said infrared receiving part are moved toward said second electrode, and said infrared receiving part being defined to be a limited area positioned under said window, wherein said semiconductor crystal infrared detecting portion comprises a first half region defined between said infrared receiving part and said first electrode and a second half region defined between said infrared receiving part and said second electrode, and at least said second half region reduces in section area toward said second electrode to increase a resistance of at least said second half region.

2. The photoconductive infrared detector as claimed in claim 1, wherein said semiconductor crystal infrared detecting portion reduces in section area toward said second electrode.

3. The photoconductive infrared detector as claimed in claim 2, wherein said semiconductor crystal infrared detecting portion remains unchanged in thickness but reduces in width toward said second electrode.

4. The photoconductive infrared detector as claimed in claim 3, wherein said semiconductor crystal infrared detecting portion does proportionally and linearly reduce in width toward said second electrode so that side edge outlines in plane view of said semiconductor crystal infrared detecting portion describe straight lines.

5. The photoconductive infrared detector as claimed in claim 3, wherein said semiconductor crystal infrared detecting portion does smoothly and curvilinearly reduce in width toward said second electrode so that side edge outlines in plane view of said semiconductor crystal infrared detecting portion describe smooth curves.

6. The photoconductive infrared detector as claimed in claim 5, wherein said semiconductor crystal infrared detecting portion does exponentially reduce in width toward said second electrode so that side edge outlines in plane view of said semiconductor crystal infrared detecting portion describe symmetrical exponential function curves.

7. The photoconductive infrared detector as claimed in claim 6, wherein each of said symmetrical exponential function curves is given by $F(X)=A/[1+\exp\{(X-B)/C\}]$, where A, B, and C are constants and $F(X)$ is a distance of said side edge of said semiconductor crystal infrared detecting portion from an X-axis which is defined to be a longitudinal center axis of said semiconductor crystal infrared detecting portion and "X" represents a position on said X-axis.

8. The photoconductive infrared detector as claimed in claim 6, wherein each of said symmetrical exponential function curves is given by $F(X)=D\times\exp(-EX)$, where D and E are constants and $F(X)$ is a distance of said side edge of said semiconductor crystal infrared ray detecting portion from an X-axis which is defined to be a longitudinal center axis of said semiconductor crystal infrared detecting portion and "X" represents a position on said X-axis.

9. The photoconductive infrared detector as claimed in claim 3, wherein said semiconductor crystal infrared detecting portion does non-smoothly and non-linearly reduce in width toward said second electrode so that side edge outlines in plane view of said semiconductor crystal infrared detecting portion describe non-smooth and non-linear lines.

10. The photoconductive infrared detector as claimed in claim 1, wherein only said second half region of said semiconductor crystal infrared detecting portion does proportionally and linearly reduce in width toward said second electrode so that side edge outlines in plane view of said second half region describe straight lines.

11. The photoconductive infrared detector as claimed in claim 1, wherein only said second half region of said semiconductor crystal infrared detecting portion does smoothly and curvilinearly reduce in width toward said second electrode so that side edge outlines in plane view of said second half region describe smooth curves.

12. The photoconductive infrared detector as claimed in claim 11, wherein only said second half region of said semiconductor crystal infrared detecting portion does exponentially reduce in width toward said second electrode so that side edge outlines in plane view of said second half region describe symmetrical exponential function curves.

13. The photoconductive infrared detector as claimed in claim 12, wherein each of said symmetrical exponential function curves is given by $F(X)=A/[1+\exp\{(X-B)/C\}]$, where A, B, and C are constants and $F(X)$ is a distance of said side edge of said semiconductor crystal infrared detecting portion from an X-axis which is defined to be a longitudinal center axis of said semiconductor crystal infrared detecting portion and "X" represents a position on said X-axis.

14. The photoconductive infrared detector as claimed in claim 12, wherein each of said symmetrical exponential function curves is given by $F(X)=D\times\exp(-EX)$, where D and E are constants and $F(X)$ is a distance of said side edge of said semiconductor crystal infrared detecting portion from an X-axis which is defined to be a longitudinal center axis of said semiconductor crystal infrared detecting portion and "X" represents a position on said X-axis.

15. The photoconductive infrared detector as claimed in claim 1, wherein only said second half region of said semiconductor crystal infrared detecting portion does non-smoothly and non-linearly reduce in width only said second half region describe non-smooth and non-linear lines.

16. The photoconductive infrared detector as claimed in claim 1, wherein said first half region of said semiconductor crystal infrared detecting portion does smoothly and curvilinearly reduce in width toward said second electrode so that side edge outlines in plane view of said first half region describe smooth curves, while said second half region of said semiconductor crystal infrared detecting portion does proportionally and linearly reduce in width toward said second electrode so that side edge outlines in plane view of said second half region describe straight lines.

17. The photoconductive infrared detector as claimed in claim 1, wherein said first half region of said semiconductor crystal infrared detecting portion does proportionally and linearly reduce in width toward said second electrode so that side edge outlines in plane view of said first half region describe straight lines, while said second half region of said semiconductor crystal infrared detecting portion does smoothly and curvilinearly reduce in width toward said second electrode so that side edge outlines in plane view of said second half region describe smooth curves.

18. The photoconductive infrared detector as claimed in claim 17, wherein said second half region of said semiconductor crystal infrared detecting portion does exponentially reduce in width toward said second electrode so that side edge outlines in plane view of said second half region describe symmetrical exponential function curves.

19. The photoconductive infrared detector as claimed in claim 18, wherein each of said symmetrical exponential function curves is given by $F(X)=A/[1+\exp\{(X-B)/C\}]$, where A, B, and C are constants and $F(X)$ is a distance of said side edge of said semiconductor crystal infrared detecting portion from an X-axis which is defined to be a longitudinal center axis of said semiconductor crystal infrared detecting portion and "X" represents a position on said X-axis.

20. The photoconductive infrared detector as claimed in claim 18, wherein each of said symmetrical exponential function curves is given by $F(X)=D\times\exp(\times EX)$, where D and E are constants and $F(X)$ is a distance of said side edge of said semiconductor crystal infrared detecting portion from an X-axis which is defined to be a longitudinal center axis of said semiconductor crystal infrared detecting portion and "X" represents a position on said X-axis.

21. A semiconductor crystal infrared detecting portion structure provided in a photoconductive infrared detector, said semiconductor crystal infrared detecting portion structure being provided at opposite ends with first and second electrodes so biased that said first and second electrodes have a positive potential and a ground potential respectively, said semiconductor crystal infrared detecting portion structure having an infrared receiving part so that said semiconductor crystal infrared detecting portion structure comprises a first half region defined between said infrared receiving part and said first electrode and a second half region defined between said infrared receiving part and said second electrode,
wherein at least said second half region reduces in section area toward said second electrode to increase a resistance of at least said second half region.

22. The semiconductor crystal infrared detecting portion structure as claimed in claim 21, wherein said semiconductor crystal infrared detecting portion structure reduces in section area toward said second electrode.

23. The semiconductor crystal infrared detecting portion structure as claimed in claim 22, wherein said semiconductor crystal infrared detecting portion structure remains unchanged in thickness but reduces in width toward said second electrode.

24. The semiconductor crystal infrared detecting portion structure as claimed in claim 23, wherein said semiconductor crystal infrared detecting portion structure does proportionally and linearly reduce in width toward said second electrode so that side edge outlines in plane view of said semiconductor crystal infrared detecting portion structure describe straight lines.

25. The semiconductor crystal infrared detecting portion structure as claimed in claim 23, wherein said semiconductor crystal infrared detecting portion structure does smoothly and curvilinearly reduce in width toward said second electrode so that side edge outlines in plane view of said semiconductor crystal infrared detecting portion structure describe smooth curves.

26. The semiconductor crystal infrared detecting portion structure as claimed in claim 25, wherein said semiconductor crystal infrared detecting portion structure does exponentially reduce in width toward said second electrode so that side edge outlines in plane view of said semiconductor crystal infrared detecting portion structure describe symmetrical exponential function curves.

27. The semiconductor crystal infrared detecting portion structure as claimed in claim 26, wherein each of said symmetrical exponential function curves is given by $F(X)=A/[1+\exp\{(X-B)/C\}]$, where A, B, and C are constants and $F(X)$ is a distance of said side edge of said semiconductor crystal infrared ray detecting portion structure from an X-axis which is defined to be a longitudinal center axis of said semiconductor crystal infrared detecting portion structure and "X" represents a position on said X-axis.

28. The semiconductor crystal infrared detecting portion structure as claimed in claim 26, wherein each of said symmetrical exponential function curves is given by $F(X)=D\times\exp(-EX)$, where D and E are constants and $F(X)$ is a distance of said side edge of said semiconductor crystal infrared detecting portion structure from an X-axis which is defined to be a longitudinal center axis of said semiconductor crystal infrared detecting portion structure and "X" represents a position on said X-axis.

29. The semiconductor crystal infrared detecting portion structure as claimed in claim 23, wherein said semiconductor crystal infrared detecting portion structure does non-smoothly and non-linearly reduce in width toward said second electrode so that side edge outlines in plane view of said semiconductor crystal infrared detecting portion structure describe non-smooth and non-linear lines.

30. The semiconductor crystal infrared detecting portion structure as claimed in claim 21, wherein only said second half region of said semiconductor crystal infrared detecting portion structure does proportionally and linearly reduce in width toward said second electrode so that side edge outlines in plane view of said second half region describe straight lines.

31. The semiconductor crystal infrared detecting portion structure as claimed in claim 21, wherein only said second half region of said semiconductor crystal infrared detecting portion structure does smoothly and curvilinearly reduce in width toward said second electrode so that side edge outlines in plane view of said second half region describe smooth curves.

32. The semiconductor crystal infrared detecting portion structure as claimed in claim 31, wherein only said second half region of said semiconductor crystal infrared detecting portion structure does exponentially reduce in width toward said second electrode so that side edge outlines in plane view of said second half region describe symmetrical exponential function curves.

33. The semiconductor crystal infrared detecting portion structure as claimed in claim 32, wherein each of said symmetrical exponential function curves is given by $F(X)= A/[1+\exp\{(X-B)/C\}]$, where A, B, and C are constants and $F(X)$ is a distance of said side edge of said semiconductor crystal infrared detecting portion structure from an X-axis which is defined to be a longitudinal center axis of said semiconductor crystal infrared detecting portion structure and "X" represents a position on said X-axis.

34. The semiconductor crystal infrared detecting portion structure as claimed in claim 32, wherein each of said symmetrical exponential function curves is given by $F(X)= D \times \exp(-EX)$, where D and E are constants and $F(X)$ is a distance of said side edge of said semiconductor crystal infrared detecting portion structure from an X-axis which is defined to be a longitudinal center axis of said semiconductor crystal infrared detecting portion structure and "X" represents a position on said X-axis.

35. The semiconductor crystal infrared detecting portion structure as claimed in claim 21, wherein only said second half region of said semiconductor crystal infrared detecting portion structure does non-smoothly and non-linearly reduce in width only said second half region describe non-smooth and non-linear lines.

36. The semiconductor crystal infrared detecting portion structure as claimed in claim 21, wherein said first half region of said semiconductor crystal infrared detecting portion structure does smoothly and curvilinearly reduce in width toward said second electrode so that side edge outlines in plane view of said first half region describe smooth curves, while said second half region of said semiconductor crystal infrared detecting portion structure does proportionally and linearly reduce in width toward said second electrode so that side edge outlines in plane view of said second half region describe straight lines.

37. The semiconductor crystal infrared detecting portion structure as claimed in claim 21, wherein said first half region of said semiconductor crystal infrared detecting portion structure does proportionally and linearly reduce in width toward said second electrode so that side edge outlines in plane view of said first half region describe straight lines, while said second half region of said semiconductor crystal infrared detecting portion structure does smoothly and curvilinearly reduce in width toward said second electrode so that side edge outlines in plane view of said second half region describe smooth curves.

38. The semiconductor crystal infrared detecting portion structure as claimed in claim 37, wherein said second half region of said semiconductor crystal infrared detecting portion structure does exponentially reduce in width toward said second electrode so that side edge outlines in plane view of said second half region describe symmetrical exponential function curves.

39. The semiconductor crystal infrared detecting portion structure as claimed in claim 38, wherein each of said symmetrical exponential function curves is given by $F(X)= A/[1+\exp\{(X-B)/C\}]$, where A, B, and C are constants and $F(X)$ is a distance of said side edge of said semiconductor crystal infrared ray detecting portion structure from an X-axis which is defined to be a longitudinal center axis of said semiconductor crystal infrared detecting portion structure and "X" represents a position on said X-axis.

40. The semiconductor crystal infrared detecting portion structure as claimed in claim 38, wherein each of said symmetrical exponential function curves is given by $F(X)= D \times \exp(-EX)$, where D and E are constants and $F(X)$ is a distance of said side edge of said semiconductor crystal infrared detecting portion structure from an X-axis which is defined to be a longitudinal center axis of said semiconductor crystal infrared detecting portion structure and "X" represents a position on said X-axis.

* * * * *